(12) United States Patent
Nishihara

(10) Patent No.: US 9,355,868 B2
(45) Date of Patent: May 31, 2016

(54) METHOD OF MANUFACTURING SEMICONDUCTOR DEVICE

(71) Applicant: Mitsubishi Electric Corporation, Tokyo (JP)

(72) Inventor: Tatsuto Nishihara, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 14/743,709

(22) Filed: Jun. 18, 2015

(65) Prior Publication Data

US 2016/0111300 A1 Apr. 21, 2016

(30) Foreign Application Priority Data

Oct. 15, 2014 (JP) ................................. 2014-210752

(51) Int. Cl.
*H01L 21/50* (2006.01)
*H01L 21/48* (2006.01)

(52) U.S. Cl.
CPC ........ *H01L 21/4825* (2013.01); *H01L 21/4817* (2013.01); *H01L 21/4871* (2013.01)

(58) Field of Classification Search
CPC ............ H01L 21/4825; H01L 21/4817; H01L 21/4871; H01L 21/4832
USPC ....................................................... 438/122
See application file for complete search history.

(56) References Cited

U.S. PATENT DOCUMENTS

| 3,946,428 A | * | 3/1976 | Anazawa | H01L 23/047 257/664 |
| 6,218,730 B1 | * | 4/2001 | Toy | H01L 23/10 257/704 |
| 6,333,460 B1 | * | 12/2001 | Toy | H01L 21/50 174/539 |
| 6,661,661 B2 | * | 12/2003 | Gaynes | H01L 23/3675 257/713 |
| 7,121,402 B2 | * | 10/2006 | Van Heerden | B65D 77/10 206/222 |
| 7,538,421 B2 | * | 5/2009 | Chen | H01L 23/16 257/704 |
| 7,667,324 B2 | * | 2/2010 | Wang | B81C 1/00269 257/738 |
| 8,505,804 B2 | * | 8/2013 | Ogashiwa | B22F 1/0074 228/110.1 |
| 8,679,900 B2 | * | 3/2014 | Choi | H01L 23/36 257/718 |
| 8,847,381 B2 | * | 9/2014 | Ueda | H01L 23/057 257/678 |

FOREIGN PATENT DOCUMENTS

| JP | H02-111055 A | 4/1990 |
| JP | H03-116947 A | 5/1991 |

* cited by examiner

*Primary Examiner* — Luan C Thai
(74) *Attorney, Agent, or Firm* — Studebaker & Brackett PC

(57) ABSTRACT

A method of manufacturing a semiconductor device includes the steps of placing, on a heat sink made of a metal, a semiconductor element and a frame surrounding the semiconductor element, placing solder on an upper surface of the frame, placing a cap on the solder, and heating the solder while exerting on the cap a force to be applied toward the frame without scrubbing the cap on the frame. In the heating step a heat source is brought into contact with the heat sink and the solder is heated with the heat source.

11 Claims, 8 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device used for data communication, for example.

2. Background Art

Japanese Patent Laid-Open No. 2-111055 discloses a semiconductor encapsulation package having a semiconductor element surrounded by a ceramic base (frame) and a cap joined to each other with solder. An induced current is caused to flow through the solder, thereby melting the solder and joining the frame and the cap together.

In some cases, the solder between the frame and the cap is melted by using a heat source such as a hot plate. In such cases, there is a need to secure fixing with solder by vibrating (scrubbing) the cap on the frame. There is a problem that, as a result of this scrubbing, the molten solder is formed into granules and scattered in the package and an oxide film formed on the surface of the solder falls in lump form onto an internal portion of the package.

In order to avoid these detriments, there is a need to manage the oxygen concentration in the soldering place, increase the operator's soldering skill and check the existence/nonexistence of solder in the packages of all finished products.

SUMMARY OF THE INVENTION

The present invention was made to solve the above-described problems, and an object of the present invention is to provide a method of manufacturing a semiconductor device enabling prevention of intrusion of solder into the package.

The features and advantages of the present invention may be summarized as follows.

According to one aspect of the present invention, a method of manufacturing a semiconductor device includes the steps of placing, on a heat sink made of a metal, a semiconductor element and a frame surrounding the semiconductor element, placing solder on an upper surface of the frame, placing a cap on the solder, and heating the solder while exerting on the cap a force to be applied toward the frame without scrubbing the cap on the frame. The heating step a heat source is brought into contact with the heat sink and the solder is heated with the heat source.

Other and further objects, features and advantages of the invention will appear more fully from the following description.

DETAILED DESCRIPTION OF THE PREFERRED EMBODIMENTS

Figure 1:
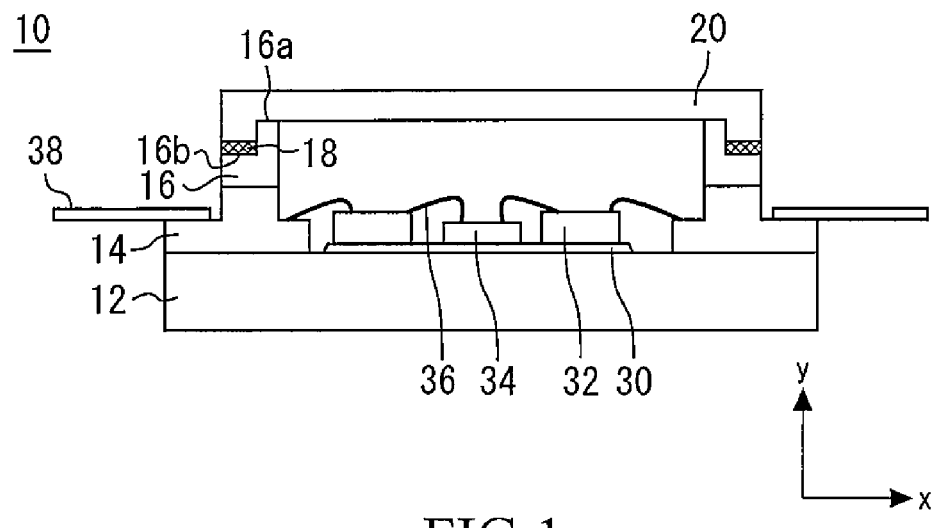
FIG. 1 is a sectional view of a semiconductor device.

A method of manufacturing a semiconductor device according to an embodiment of the present invention will be described with reference to the accompanying drawings. Components identical or corresponding to each other are indicated by the same reference characters and repeated description for them is avoided in some cases.

First Embodiment

FIG. 1 is a sectional view of a semiconductor device 10 manufactured by a semiconductor device manufacturing method according to a first embodiment of the present invention. The semiconductor device 10 has a heat sink 12 formed of a metal. A feed-through 14 and a frame 16 are provided on the heat sink 12. A gold plating, for example, is formed on surfaces of the heat sink 12, the frame 16 and the feed-through 14. The frame 16 is a metal in annular form as viewed in plan. A great part of the frame 16 abuts on the heat sink 12. The upper surface of the frame 16 has a first upper surface 16*a* at an inner edge side and a second upper surface 16*b* at an outer edge side. The position of the first upper surface 16*a* is higher than that of the second upper surface 16*b*. Solder 18 is provided on the second upper surface 16*b*. The solder 18 has the shape of a ring as viewed in plan. The frame 16 and a cap 20 are joined to each other with the solder 18. The cap 20 is a metal having a downwardly projecting portion. This projecting portion abuts on the solder 18. A gold plating, for example, is formed on surfaces of the cap 20 and the frame 16.

A circuit substrate 32 and a semiconductor element 34 are fixed on the heat sink 12 with solder 30. The circuit substrate 32 and a semiconductor element 34 are in a space surrounded by the frame 16. The semiconductor element 34 is connected to the feed-through 14 by a wire 36 via the circuit substrate 32. A lead terminal 38 extending to the outside is connected to the feed-through 14. Accordingly, the feed-through 14 establishes an electrical connection between the semiconductor element 34 and the outside.

Figure 2:
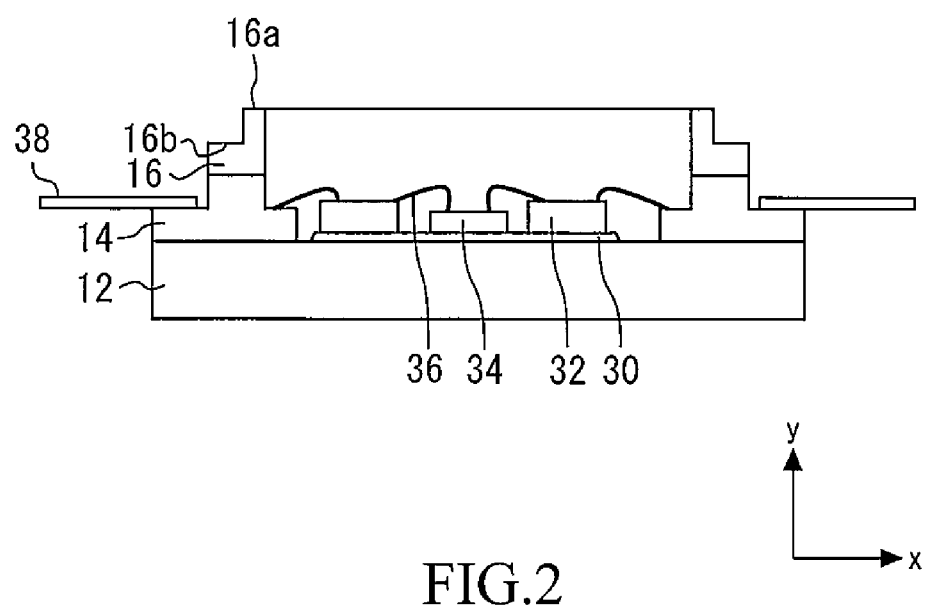
FIG. 2 is a sectional view of a semifinished product.

The method of manufacturing the semiconductor device 10 will be described. The semiconductor element and the frame surrounding the semiconductor element are first placed on the heat sink. FIG. 2 is a sectional view of a semifinished product showing a state where components including the semiconductor element 34 and the frame 16 are placed on the heat sink 12. In this process step, the feed-through 14 is placed on the heat sink 12 and the circuit substrate 32 is soldered to the heat sink 12. Further, the wire 36 is connected to the semiconductor element 34 and other components.

Figure 3:
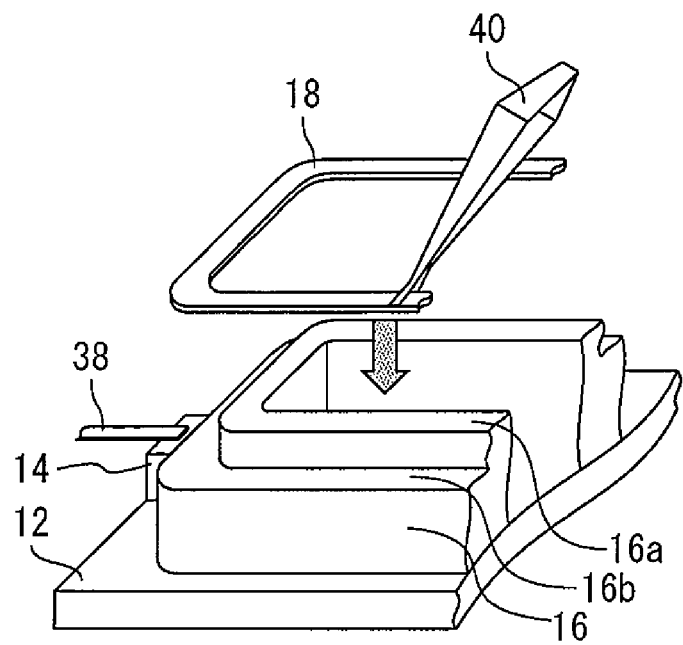
FIG. 3 shows the solder held with tweezers.
Figure 4:
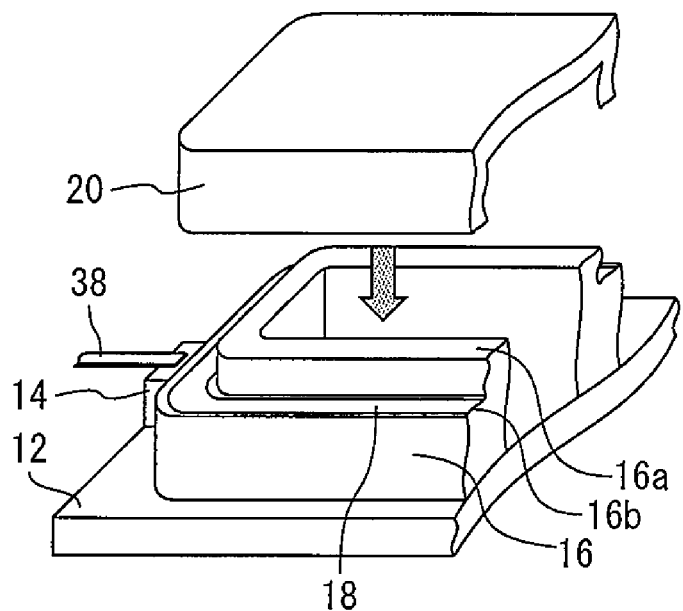
FIG. 4 shows the cap placed on the solder.
Figure 5:
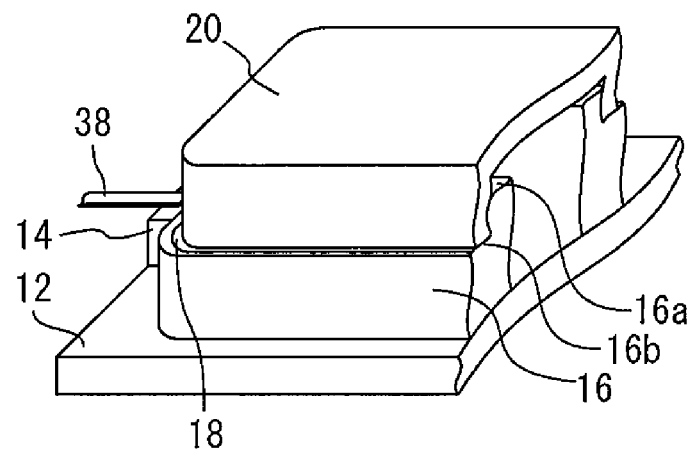
FIG. 5 is a perspective view of the semifinished product.

Subsequently, the solder 18 is held with tweezers 40 as shown in FIG. 3 and is placed on the upper surface (second upper surface 16b) of the frame 16. The cap 20 is then placed on the solder 18, as shown in FIG. 4. FIG. 5 is a perspective view of the semifinished product after the cap 20 is placed on the solder 18.

Figure 6:
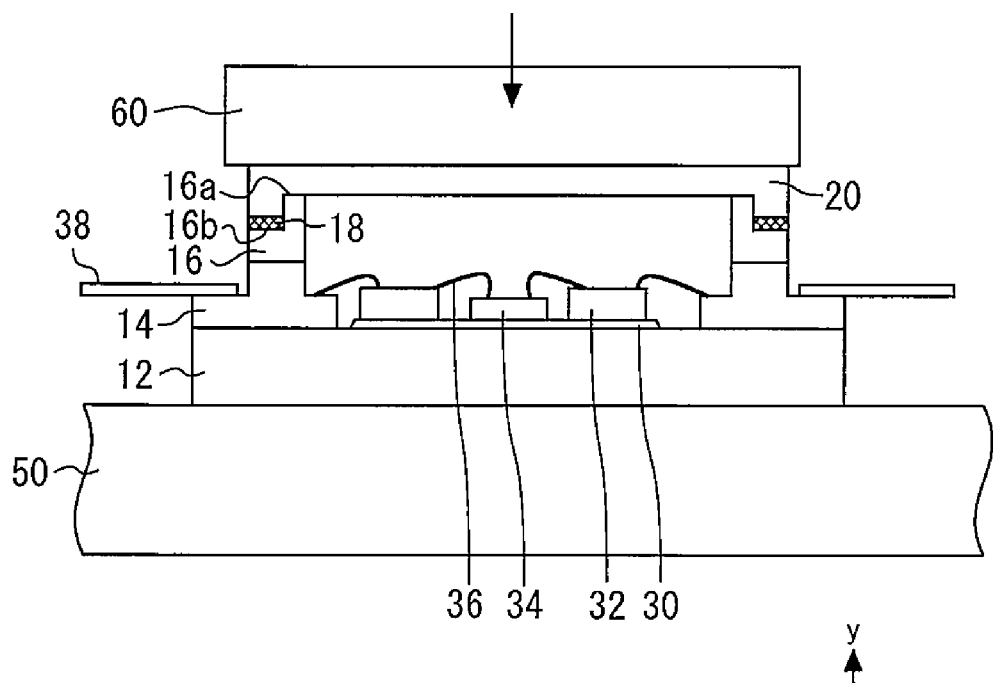
FIG. 6 is a sectional view of the semifinished product for explaining the heating step.

Subsequently, the process advances to a heating step. FIG. 6 is a sectional view of the semifinished product for explaining the heating step. A heat source 50 such as a hot plate is brought into contact with the heat sink 12. Also, a weight 60 is placed on the cap 20. In the heating step, the solder 18 is heated with the heat source 50 while a force to be applied toward the frame 16 (indicated by an arrow in FIG. 6) is being exerted on the cap 20 with the weight 60, without the cap 20 being scrubbed on the frame 16.

Heat generated in the heat source 50 is conducted to the solder 18 via the heat sink 12, the feed-through 14 and the frame 16, thereby heating the solder 18. If the solder 18 is gold tin (AuSn)-based solder, the solder 18 is heated to a temperature equal to or higher than 280° C. The solder 18 is melted by the heating step to join the cap 20 and the frame 16 together. The semiconductor device manufacturing method according to the first embodiment of the present invention includes the above-described process steps.

In the heating step in the semiconductor device manufacturing method according to the first embodiment of the present invention, a force to be applied toward the frame 16 is exerted on the cap 20 without the cap 20 being scrubbed on the frame 16. Since scrubbing is not performed, prevention of intrusion of the solder into the interior of the package (the space surrounded by the frame 16, referred to in the same expression below) can be achieved. Also, since the force to be applied toward the frame 16 is exerted on the cap 20, the frame 16 and the cap 20 can be joined together with reliability, as in the case where scrubbing is performed.

Since the first upper surface 16a higher than the second upper surface 16b is provided at the inner edge side of the frame 16, a portion of the frame 16 including the first upper surface 16a functions as a protective barrier against the solder. Prevention of intrusion of the solder into the interior of the package is thus enabled.

In the case of the semiconductor encapsulation package disclosed in Japanese Patent Laid-Open No. 2-111055, there is a need to metalize a portion of the ceramic frame in order to concentrate the induced current on a particular position. Therefore, the semiconductor encapsulation package disclosed in Japanese Patent Laid-Open No. 2-111055 tends to be higher in cost. On the other hand, the semiconductor device manufacturing method according to the first embodiment of the present invention uses heating of the solder with the heat source 50 instead of induction heating, thereby eliminates the need for partial metalization and is suitable for reducing the manufacturing cost.

The semiconductor device manufacturing method according to the first embodiment of the present invention enables prevention of intrusion of the solder into the interior of the package and thereby eliminates the need for checking each of finished products as to whether or not the solder has intruded into the interior of the package. The inspection cost can be limited, for example, by checking a certain number of products at a time or by making sampling inspection.

Figure 7:
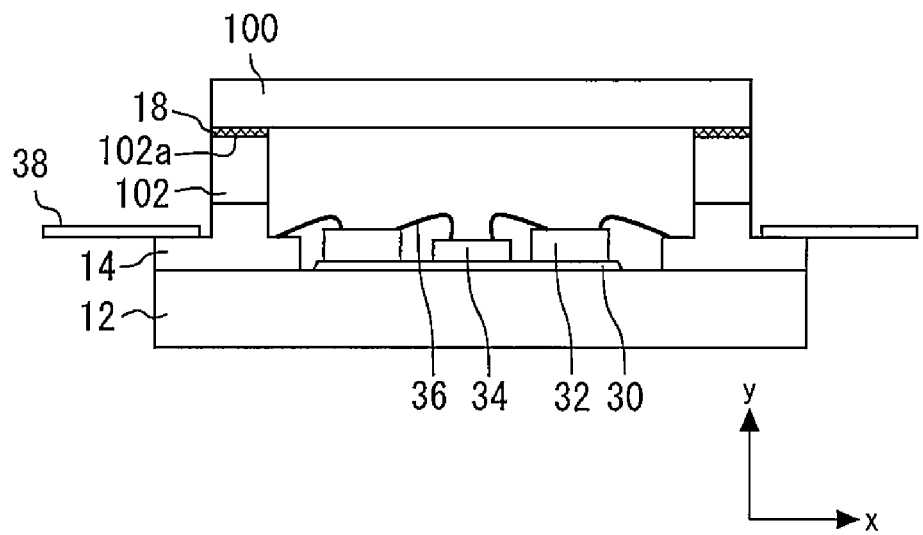
FIG. 7 is a sectional view of a semiconductor device according to a modified example.

FIG. 7 is a sectional view of a semiconductor device according to a modified example. A cap 100 has a flat shape without any projection/recess. A frame 102 has a flat upper surface 102a. If the cap 100 is scrubbed on the frame 102 in such a construction, there is a possibility of the solder 18 intruding into the interior of the package. However, since scrubbing is not performed in the first embodiment of the present invention, the solder can be prevented from intruding into the interior of the package. The cap 100 can be joined to the frame 102 with reliability by being forced toward the frame 102 in the heating step.

A clearance may be provided between the frame 16 and the side surface of the projecting portion of the cap 20. It is preferable to set the clearance between the second upper surface 16b of the frame 16 and the projecting portion of the cap 20 smaller than the thickness of the solder 18. If the inner circumference of the solder 18 before melting is set larger than the inner circumference of the second upper surface 16b, the facility with which the solder 18 is placed on the second upper surface 16b is improved. Other various modifications can be made to the semiconductor device manufacturing method according to the first embodiment of the present invention. These modifications can be applied as desired to semiconductor device manufacturing methods according to other embodiments described below.

The semiconductor device manufacturing methods according to the embodiments described below have a number of commonalities with the first embodiment and will therefore be described mainly with respect to points of difference from the first embodiment.

Second Embodiment

Figure 8:
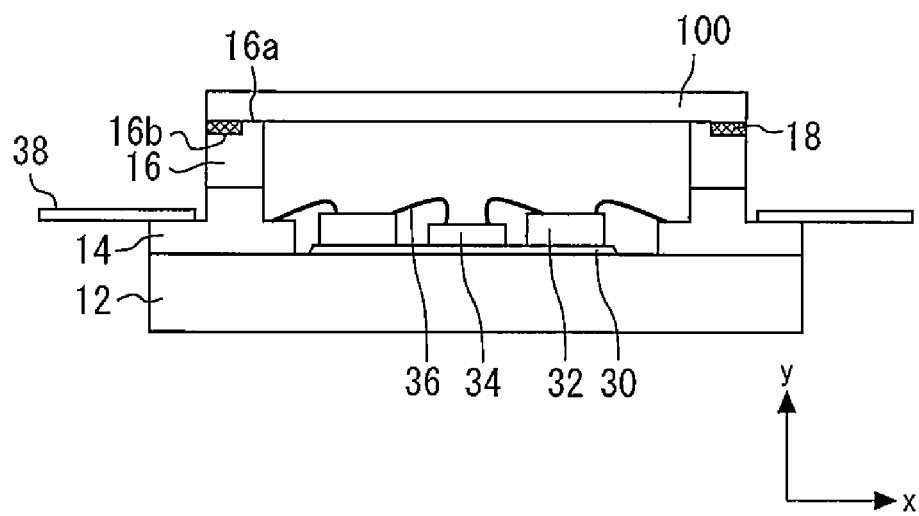
FIG. 8 is a sectional view of a semiconductor device according to the second embodiment.

FIG. 8 is a sectional view of a semiconductor device according to the second embodiment. The cap 100 has a flat shape without any projection/recess. The difference in height between the first upper surface 16a and the second upper surface 16b is set equal to the thickness of the solder 18, thereby eliminating the need for the provision of a specially formed portion of the cap 100 such as a projecting portion. Forming the cap 100 into a flat shape without any projection/recess is effective in limiting the cost of working for forming the cap 100.

Third Embodiment

Figure 9:
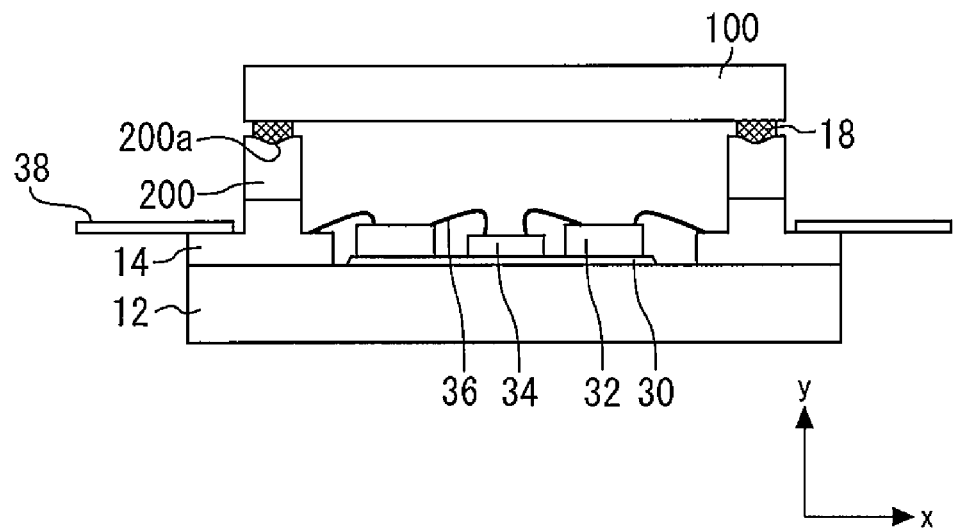
FIG. 9 is a sectional view of a semiconductor device according to the third embodiment.

FIG. 9 is a sectional view of a semiconductor device according to the third embodiment. A recess 200a is formed in an upper surface of a frame 200. The recess 200a, whose shape is not particularly specified, is, for example, a V-shaped groove. In the heating step, the molten solder 18 fills this recess 200a. Therefore, since the solder 18 do not spread through a wide area on the upper surface of the frame 200, the intrusion of solder into the interior of the package is prevented from occurring.

Fourth Embodiment

Figure 10:
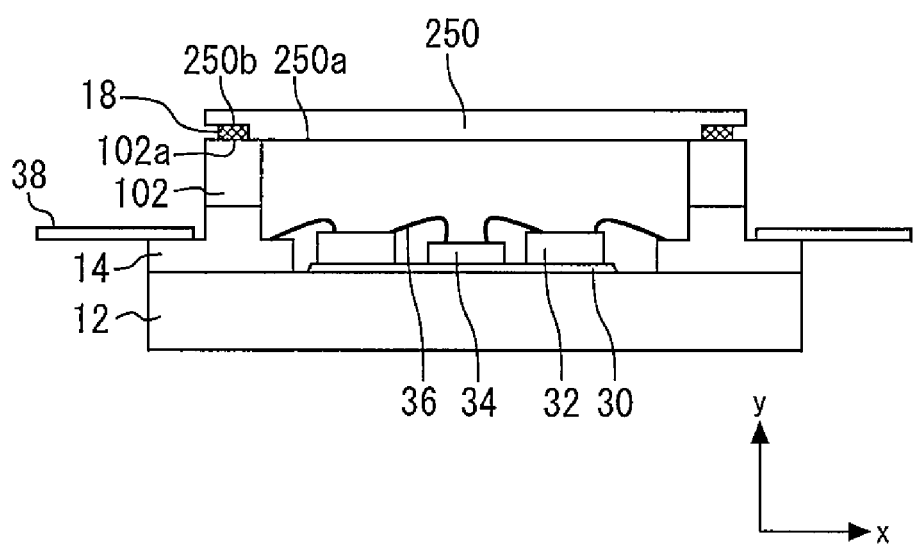
FIG. 10 is a sectional view of a semiconductor device according to the fourth embodiment.

FIG. 10 is a sectional view of a semiconductor device according to the fourth embodiment. An upper surface 102a of a frame 102 has a flat shape. A cap 250 has a first lower surface 250a and a second lower surface 250b positioned higher than the first lower surface 250a. It is preferable to set the difference in height between the first lower surface 250a and the second lower surface 250b equal to the thickness of the solder 18. The second lower surface 250b surrounds the first lower surface 250a as viewed in plan. A portion of the upper surface 102a of the frame 102 including the inner edge abuts directly on the first lower surface 250a of the cap 250.

By bringing the portion of the upper surface 102a of the frame 102 including the inner edge into direct contact with the first lower surface 250a, intrusion of the solder 18 into the interior of the package in the heating step can be prevented.

Also, the cost of working for forming the frame 102 can be limited by forming the upper surface 102a of the frame 102 into a flat shape.

In order to reliably prevent the solder 18 from intruding into the interior of the package, it is preferable that the contact between the cap 250 and the portion of the upper surface 102a of the frame 102 including the inner edge be in the form of a ring without any discontinuity as viewed in plan.

Figure 11:
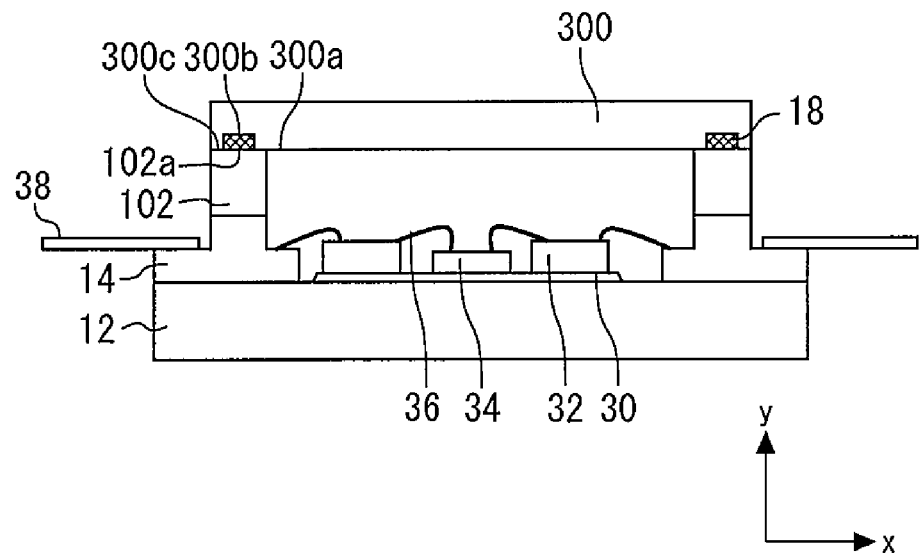
FIG. 11 is a sectional view of a semiconductor device according to a modified example.

FIG. 11 is a sectional view of a semiconductor device according to a modified example. A cap 300 has a first tower surface 300a, a second lower surface 300b and a third lower surface 300c. The third lower surface 300c is at the same position in height as the first lower surface 300a and surrounds the second lower surface 300b as viewed in plan. A portion of the upper surface 102a of the frame 102 including the outer edge abuts directly on the third lower surface 300c of the cap 300. The solder 18 can thereby be prevented from wet-spreading to the outside in the heating step.

Figure 12:
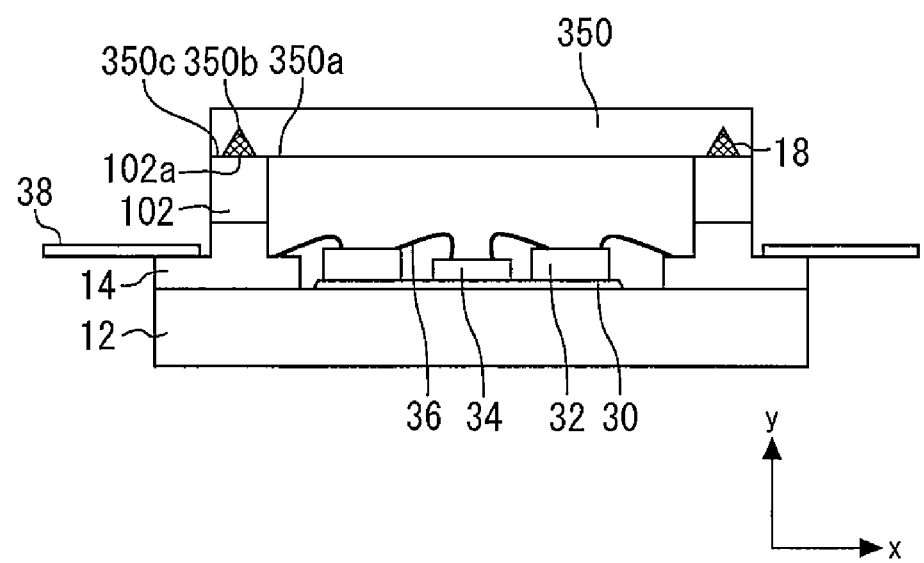
FIG. 12 is a sectional view of a semiconductor device according to another modified example.

FIG. 12 is a sectional view of a semiconductor device according to another modified example. A cap 350 has a first lower surface 350a, a second lower surface 350b and a third lower surface 350c. The second lower surface 350b forms a V-shaped recess. Use of the second lower surface 350b differing in shape from the second lower surface 300b shown in FIG. 11 also enables preventing the solder 18 from intruding into the interior of the package and from wet-spreading to the outside.

Fifth Embodiment

Figure 13:
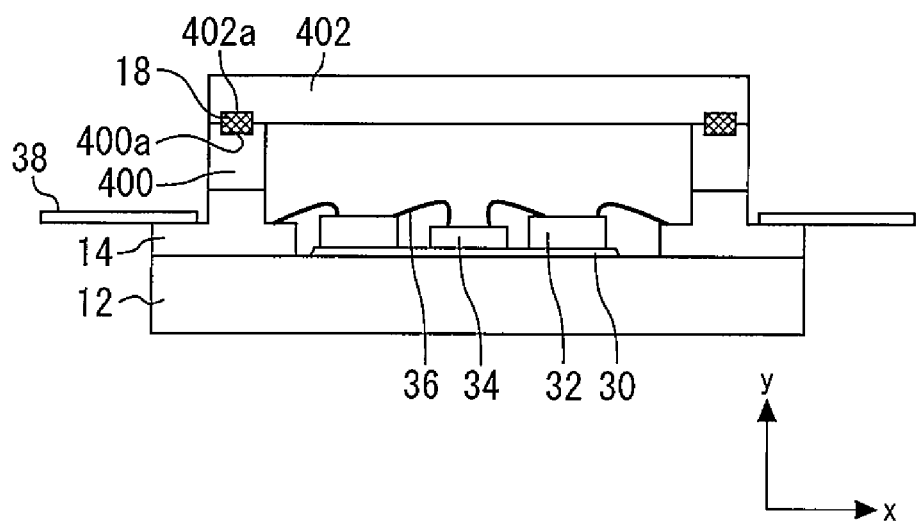
FIG. 13 is a sectional view of a semiconductor device according to the fifth embodiment.

FIG. 13 is a sectional view of a semiconductor device according to the fifth embodiment. A first recess 400a is formed in an upper surface of a frame 400. A second recess 402a is formed in a lower surface of a cap 402. The first recess 400a and the second recess 402a are superposed on each other as viewed in plan. It is preferable to set the sum of the depth of the first recess 400a and the depth of the second recess 402a equal to or smaller than the thickness of the solder 18. As a result, the solder 18 exists both in the first recess 400a and in the second recess 402a, thereby enabling increasing the strength of junction between the frame 400 and the cap 402.

Figure 14:
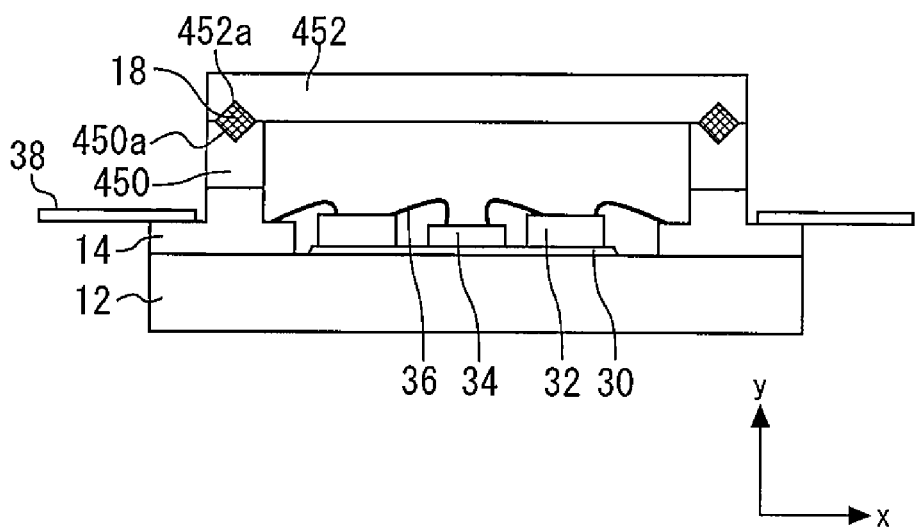
FIG. 14 is a sectional view of a semiconductor device according to a modified example.
Figure 15:
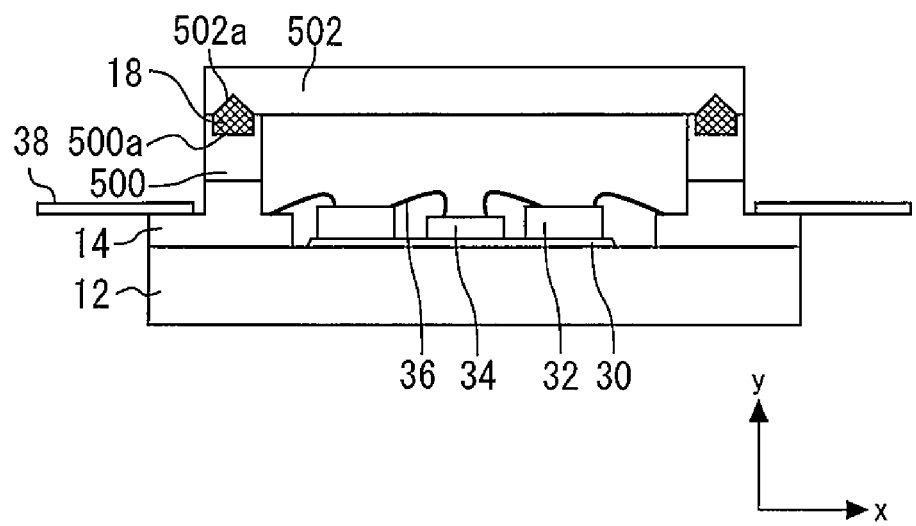
FIG. 15 is a sectional view of a semiconductor device according to another modified example.

FIG. 14 is a sectional view of a semiconductor device according to a modified example. A V-shaped first recess 450a is formed in an upper surface of a frame 450, while a V-shaped second recess 452a is formed in a lower surface of a cap 452. FIG. 15 is a sectional view of a semiconductor device according to another modified example. A U-shaped first recess 500a is formed in an upper surface of a frame 500, while a V-shaped second recess 502a is formed in a lower surface of a cap 502.

Sixth Embodiment

Figure 16:
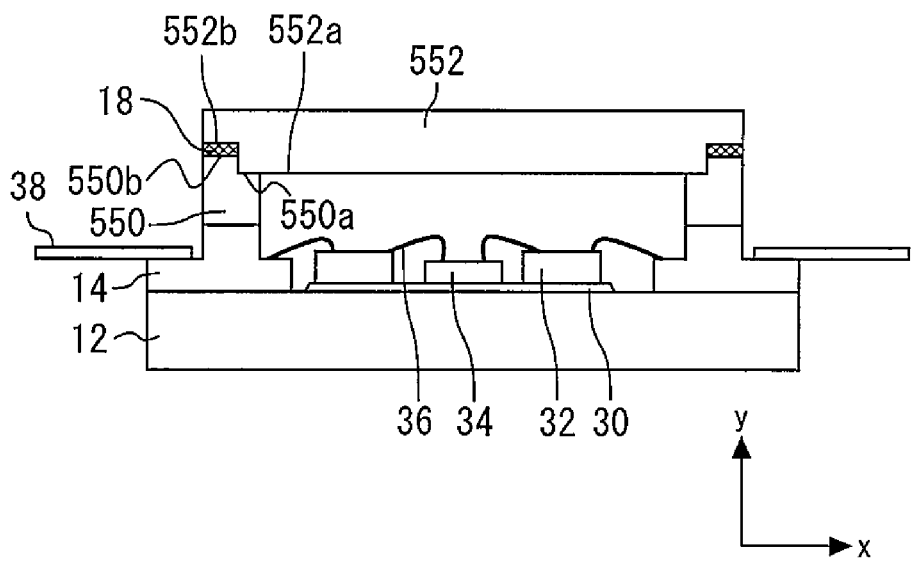
FIG. 16 is a sectional view of a semiconductor device according to the sixth embodiment.

FIG. 16 is a sectional view of a semiconductor device according to the sixth embodiment. A frame 550 has a first upper surface 550a and a second upper surface 550b higher in position than the first upper surface 550a in the height direction. The second upper surface 550b is closer to the outer edge of the frame 550 than the first upper surface 550a.

A cap 552 has a first lower surface 552a and a second lower surface 552b higher in position than the first lower surface 552a in the height direction. The second lower surface 552b is closer to the outer edge of the cap 552 than the first lower surface 552a.

Solder 18 is provided between the second lower surface 552b and the second upper surface 550b. In this arrangement, the distance through which the molten solder 18 must move before it intrudes into the interior of the package can be increased. That is, the molten solder 18 cannot intrude into the interior of the package if it does not pass between a side surface of the frame 550 and a side surface of the cap 552 and then between the first upper surface 550a and the first lower surface 552a. On the other hand, in the arrangement shown in FIG. 10, the molten solder can intrude into the interior of the package by only passing between the upper surface 102a and the first lower surface 250a.

The effect of increasing the distance through which the molten solder 18 must move before it intrudes into the interior of the package can also be obtained with the arrangement shown in FIG. 1. This effect can be obtained by bringing the side surface of the frame and the side surface of the cap into contact with each other. Note that features of each of the embodiments described above may be combined and used as appropriate.

According to the present invention, solder is heated while a force to be applied toward the frame is exerted on the cap without the cap being scrubbed on the frame, thereby preventing intrusion of solder into the package.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a semiconductor device, comprising the steps of:
   placing, on a heat sink made of a metal, a semiconductor element and a frame surrounding the semiconductor element;
   placing solder on an upper surface of the frame;
   placing a cap on the solder and the frame to thereby create, in a first region, a direct abutment between the cap and the frame, and, in a second region, an arrangement in which the solder is positioned between the cap and the frame, wherein the first region is positioned between the second region and the semiconductor element; and
   heating step for heating the solder while exerting on the cap a force to be applied toward the frame without scrubbing the cap on the frame;
   wherein in the heating step a heat source is brought into contact with the heat sink and the solder is heated with the heat source, and
   wherein the abutment between the cap and the frame in the first region prevents the solder from intruding from the second region into an interior of the semiconductor device.

2. The method of manufacturing a semiconductor device according to claim 1, wherein the upper surface of the frame includes, in the first region, a first upper surface at an inner edge side and, in the second region, a second upper surface at an outer edge side;
   the first upper surface is higher in position than the second upper surface in a height direction; and
   the solder is placed on the second upper surface.

3. The method of manufacturing a semiconductor device according to claim 1, wherein the cap has a flat shape without any recess or projection.

4. The method of manufacturing a semiconductor device according to claim 1, wherein the upper surface of the frame has a flat shape.

5. The method of manufacturing a semiconductor device according to claim 1, wherein a recess is formed in the upper surface of the frame, and the solder fills the recess in the heating step.

6. The method of manufacturing a semiconductor device according to claim 1, wherein an inner edge of the upper surface of the frame abuts directly on the cap in the heating step.

7. The method of manufacturing a semiconductor device according to claim 6, wherein an outer edge of the upper surface of the frame abuts directly on the cap in the heating step.

8. The method of manufacturing a semiconductor device according to claim 1, wherein a first recess is formed in the upper surface of the frame;
   a second recess is formed in a lower surface of the cap, the second recess being superposed on the first recess as viewed in plan; and
   the solder is provided in the first recess and the second recess.

9. The method of manufacturing a semiconductor device according to claim 1, wherein a side surface of the frame and a side surface of the cap abut on each other.

10. The method of manufacturing a semiconductor device according to claim 1, wherein a plating is formed on surfaces of the frame and the cap.

11. The method of manufacturing a semiconductor device according to claim 1, further comprising a feed-through for establishing an electrical connection between the semiconductor element and the outside.

* * * * *